United States Patent
Rao

(10) Patent No.: US 9,444,463 B2
(45) Date of Patent: Sep. 13, 2016

(54) VOLTAGE LEVEL SHIFTER

(71) Applicant: Invecas, Inc., Santa Clara, CA (US)

(72) Inventor: Venkata N. S. N. Rao, Fremont, CA (US)

(73) Assignee: Invecas, Inc., Santa Clara, CA (US)

( * ) Notice: Subject to any disclaimer, the term of this patent is extended or adjusted under 35 U.S.C. 154(b) by 0 days.

(21) Appl. No.: 14/608,137

(22) Filed: Jan. 28, 2015

(65) Prior Publication Data

US 2016/0218717 A1   Jul. 28, 2016

(51) Int. Cl.
*H03L 5/00* (2006.01)
*H03K 19/0185* (2006.01)

(52) U.S. Cl.
CPC .............................. *H03K 19/018528* (2013.01)

(58) Field of Classification Search
None
See application file for complete search history.

(56) References Cited

U.S. PATENT DOCUMENTS

| | | | | |
|---|---|---|---|---|
| 6,888,394 B2 * | 5/2005 | Cleary | ............. | H03K 3/356165 326/68 |
| 7,602,217 B2 * | 10/2009 | Watson | .......... | H03K 19/018528 326/113 |
| 7,737,755 B2 * | 6/2010 | Mauthe | ............ | H03K 3/356104 326/63 |
| 7,839,171 B1 * | 11/2010 | Miles | ..................... | H03K 3/011 326/63 |
| 7,936,182 B1 * | 5/2011 | Bourstein | ........ | H03K 3/356113 326/38 |
| 8,749,292 B2 * | 6/2014 | Priel | .............. | H03K 19/018521 326/62 |
| 8,860,487 B2 * | 10/2014 | Ma | ................... | H03K 3/356165 326/80 |

* cited by examiner

*Primary Examiner* — Alexander H Taningco
*Assistant Examiner* — Nelson Correa
(74) *Attorney, Agent, or Firm* — Venture Pacific Law, PC

(57) ABSTRACT

A method for voltage level shifting comprises several steps. A data signal in a first voltage domain is received by a voltage level shifter. The received data signal is shifted to a second voltage domain by the voltage level shifter, where the voltage level shifter is configured as a function of the shifted data signal. The shifted data signal is outputted.

9 Claims, 7 Drawing Sheets

VOLTAGE LEVEL SHIFTER

FIELD OF INVENTION

The present disclosure relates to methods and apparatuses for voltage domain crossing, and, more particularly, to methods and apparatuses for voltage level shifting.

BACKGROUND

Within an electronic computing device, a computing device may have multiple components that interact with each other and operate at varying voltage domains. In order for communications between the two or more components, data signals from a source component must be shifted from a first voltage domain to a different voltage domain of a destination component.

FIGS. 1a-1b illustrate block diagrams for voltage domain crossings of a computing device. Referring to FIG. 1a, a core voltage domain 10 is used to operate a processing core (not shown). The processing core communicates to input and output ("I/O") devices operating in an IO voltage domain 12, where the core voltage domain 10 and the IO voltage domain 12 are at different voltage ranges. The processing core is powered by a VDD_core voltage of the core voltage domain 10, and the I/O devices can be powered by a VDD_IO voltage of the IO voltage domain 12.

A voltage level shifter (not shown) can be used to convert the data signals between the core voltage domain 10 and the IO voltage domain 12. Referring to FIG. 1b, a data input ("DI") signal 14 is transferred from the core voltage domain 10 to the IO voltage domain 12. The voltage level shifter shifts the DI signal 14 to a data output ("DO") signal 16. The DO signal 16 is in the IO voltage domain 12 such that the signal can be used by the IO devices.

As integrated circuits' feature size continue to decrease and their frequency of operation increase, power density will also increase, thereby increasing the operational temperature. This leads to operating error and reliability issues for the integrated circuits ("ICs"). In order to keep the power density at reasonable level, operating voltages for core logic are being lowered to 0.8V or lower. However, power supplies remain higher than core voltage (e.g., 1.1 to 1.65V). As a result, a voltage level shifter is used to transfer the digital data from low voltage to a high voltage domain, and vice versa.

Voltage level shifters are used in many interface applications, e.g., double data rate ("DDR") interface, low power DDR interface, serial-to-deserial interface, analog-to-digital interface, digital-to-analog interface, and many other interfaces with multiple power supplies. An ideal level shifter shifts the input signal to a different level without the following drawbacks including any distortions to the duty cycle, any distortions to the rise and fall characteristics of the signal, and large delays. However, conventional level shifters have high latency, inconsistent performance over various combinations of the voltage level extremes, and/or distorted duty cycle in high-speed interface applications. This can have significant impact on data bandwidth as well as jitter.

Therefore, it is desirable to provide new methods, apparatuses, and systems for voltage level shifters that can have lower latency and more consistent performance.

SUMMARY OF INVENTION

Briefly, the disclosure relates to a method for voltage level shifting, comprising the steps of: receiving a data signal in a first voltage domain by a voltage level shifter; shifting the received data signal to a second voltage domain by the voltage level shifter, wherein the voltage level shifter is configured as a function of the shifted data signal; and outputting the shifted data signal.

DESCRIPTION OF THE DRAWINGS

The foregoing and other aspects of the disclosure can be better understood from the following detailed description of the embodiments when taken in conjunction with the accompanying drawings.

DETAILED DESCRIPTION OF THE EMBODIMENTS

In the following detailed description of the embodiments, reference is made to the accompanying drawings, which form a part hereof, and in which is shown by way of illustration of specific embodiments in which the disclosure may be practiced.

Figure 1A:
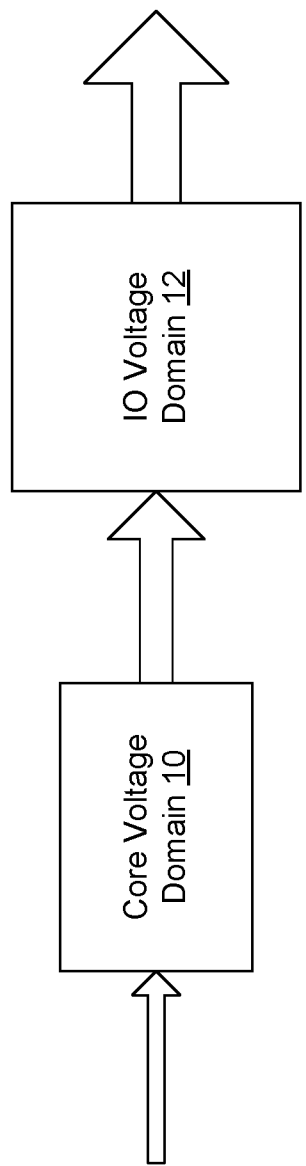
FIGS. 1a-1b illustrate block diagrams for voltage domain crossings of a computing device.
Figure 1B:
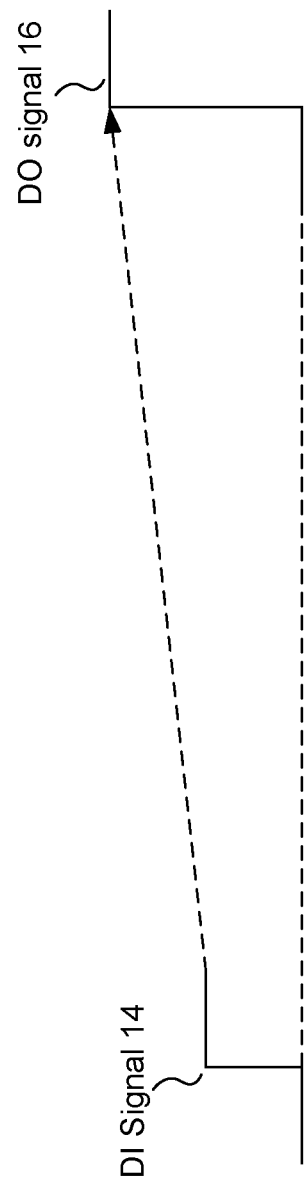
Figure 2:
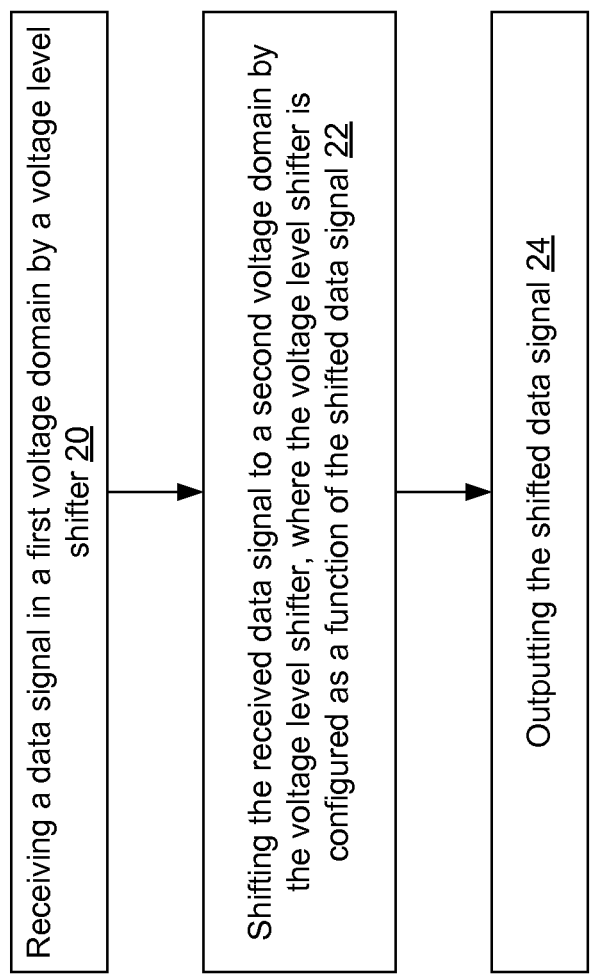
FIG. 2 illustrates a flow chart of the present disclosure for voltage level shifting.

FIG. 2 illustrates a flow chart of the present disclosure for voltage level shifting. A data signal in a first voltage domain is received by a voltage level shifter 20. The voltage level shifter shifts the received data signal to a second voltage domain 22. The voltage level shifter is configured as a function of the shifted data signal. The shifted data signal is outputted 24. The shifted data signal can be further equalized using a transition equalizer.

The shifted data signal can be used to configure the voltage level shifter. For instance for each signal transition of the shifted data signal, the level shifter can be configured by feeding back the shifted data signal to the level shifter. For instance, the shifted data signal is fed back to the level shifter to set certain conditions of the level shifter for shifting future segments of the received data signal. The shifted data signal can be delayed a predefined amount of time before being used to configure the level shifter. The following circuit diagrams will provide further details as to the configuration and reconfiguration of the level shifter using the shifted data signal.

Figure 3:
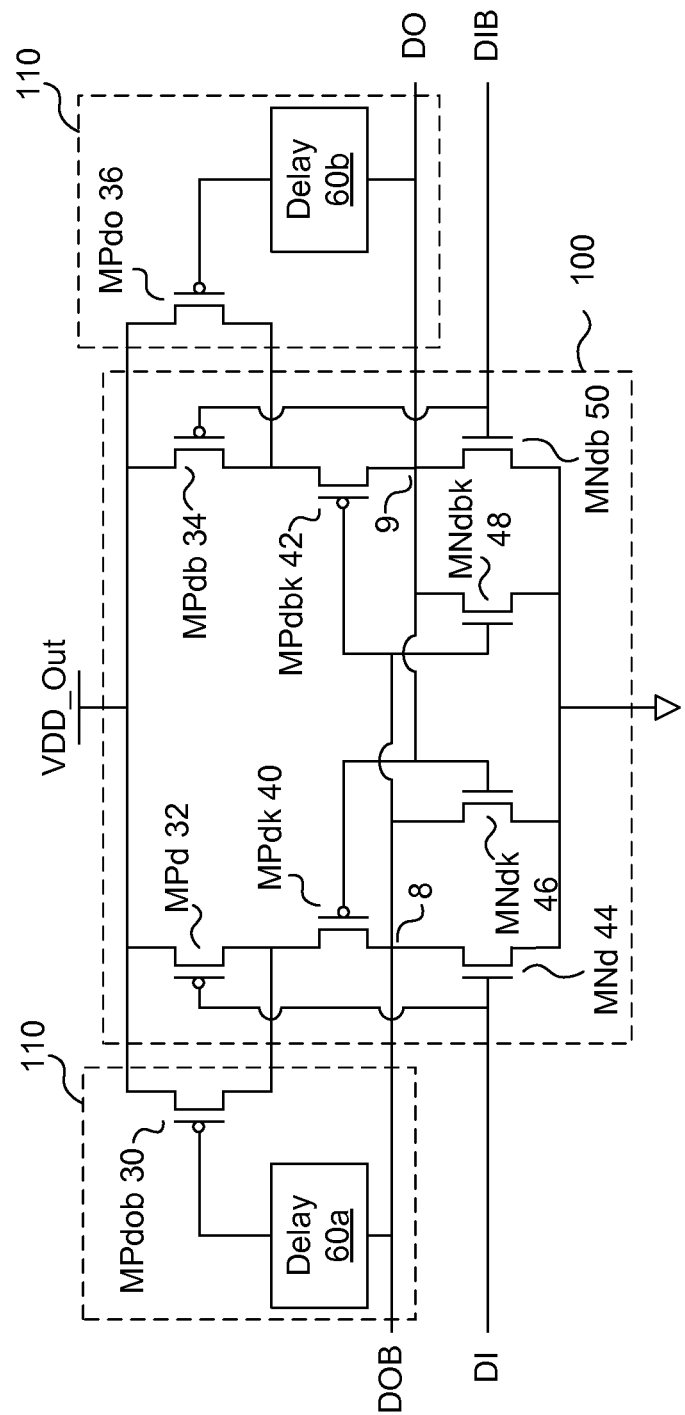
FIG. 3 illustrates a circuit diagram for a voltage level shifter of the present disclosure.

FIG. 3 illustrates a circuit diagram for a voltage level shifter of the present disclosure. A voltage level shifter of the present disclosure comprises: a main level shifting core 100, where the main level shifting core 100 shifts a data signal from a first voltage domain to a second voltage domain; and a configuration block 110, where the configuration block 110 configures the main level shifting core 100 as a function of the shifted data signal. The data signal can be a differential signal having an unbiased data signal and a biased data signal. The voltage level shifter is configured according to each signal transition of the shifted data signal.

The main level shifting core 100 comprises two branches connected in parallel across a predefined voltage VDD_Out and ground. VDD_Out can be the maximum voltage of the second voltage domain. The second voltage domain can be greater than the first voltage domain or can be smaller than the first voltage domain. The level shifting core 100 allows for shifting of a first voltage domain to a greater voltage domain or smaller voltage domain.

The first branch comprises a P-type metal-oxide-semiconductor ("PMOS") transistor MPd 32, a PMOS transistor MPdk 40, an N-type metal-oxide-semiconductor ("NMOS") transistor MNd 44, and an NMOS transistor MNdk 46. The NMOS transistors MNd 44 and MNdk 46 are connected in parallel. The PMOS transistor MPd 32 and the PMOS transistor MPdk 40 are connected in series to the NMOS transistors MNd 44 and MNdk 46 at a connection 8.

The second branch comprises a PMOS transistor MPdb 34, a PMOS transistor MPdbk 42, an NMOS transistor MNdbk 48, and an NMOS transistor MNdb 50. The NMOS transistors MNdbk 48 and MNdb 50 are connected in parallel. The PMOS transistor MPdb 34 and the PMOS transistor MPdbk 42 are connected in series to the NMOS transistors MNdbk 48 and MNdb 50 at a connection 9.

The unbiased data signal DI is applied to the gates of the PMOS transistor MPd 32 and the NMOS transistor MNd 44. The biased data signal DIB is applied to the gates of the PMOS transistor MPdb 34 and the NMOS transistor MNdb 50. The gates of the PMOS transistor MPdk 40 and the NMOS transistor MNdk 46 are connected to the connection 9. The shifted unbiased data signal DO can be outputted at the connection 9. The gates of the PMOS transistor MPdbk 42 and the NMOS transistor MNdbk 48 are connected to the connection 8. The shifted biased data signal DOB can be outputted at the connection 8.

The configuration block 110 comprises a first delay element 60$a$, a second delay element 60$b$, a PMOS transistor MPdob 30, and a PMOS transistor MPdo 36. The shifted biased data signal DOB is inputted to the delay element 60$a$. The delay element 60$a$ outputs a delayed biased data signal to the gate of the PMOS transistor MPdob 30. The PMOS transistor MPdob 30 is connected in parallel to the PMOS transistor MPd 32. The shifted unbiased data signal DO is inputted to the delay element 60$b$. The delay element 60$b$ outputs a delayed unbiased data signal to the gate of the PMOS transistor MPdo 36. The PMOS transistor MPdo 36 is connected in parallel to the PMOS transistor MPdb 34.

Without the configuration block 110, if the input data signal DI is high, then transistor MNd 44 fights with the transistors MPdk 40 and MPd 32 if the voltage difference between input (i.e., VDD_IN) and output (i.e., VDD_OUT) is high. If the transistor MPd 32 is too weak, it would affect the level shifter's rise time. If the transistor MPD 32 is too strong, it would affect functionality. Thus, the transistor MPd 32 is designed as large as possible with proper functionality.

The configuration block 110 can improve the rise time without effecting functionality. If the input data signal DI goes from low to high and was previously low, the transistor MPdob 30 is disabled, and pull down depends on transistors MPd 32, MPdk 40 and MNd 44. If the input data signal DI goes from high to low, the transistor MPdob 30 helps rise and fall times once the transistor MPdk 40's input is set to low.

It is understood by a person having ordinary skill in the art that other level shifter cores can be used in conjunction with the present disclosure. Due to the variety of level shifters, a configuration block of the present disclosure and the methods for level shifting of the present disclosure can be used in conjunction with such other level shifters. A person having ordinary skill in the art would be able to adapt this present disclosure to improve or otherwise generate a level shifter in accordance with the present disclosure. The present disclosure is meant to include those other variations of level shifters as well. The examples of the following figures use the main level shifter core 100, but the configuration blocks are different in each example. However, as stated above, such configuration blocks of the present disclosure can be used in conjunction with other level shifters.

Figure 4:
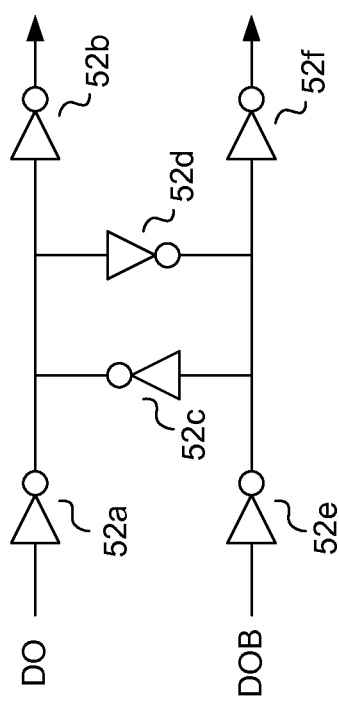
FIG. 4 illustrates a block diagram for a voltage domain transition equalizer of the present disclosure.

FIG. 4 illustrates a block diagram for a voltage domain transition equalizer of the present disclosure. In an ideal scenario, the shifted data signals DO and DOB change in opposite directions at the same time. Due to mismatches in the shifted data signals DO and DOB, the transitions may actually happen at different times. Without a cross the structure (e.g., the cross coupled inverters 52$c$ and 52$d$), the inverters' 52$a$, 52$e$, 52$b$, and 52$f$ outputs follow the inputs. However, the inclusion of inverters 52$c$ and 52$d$ can slow down the early signal transition.

Figure 5:
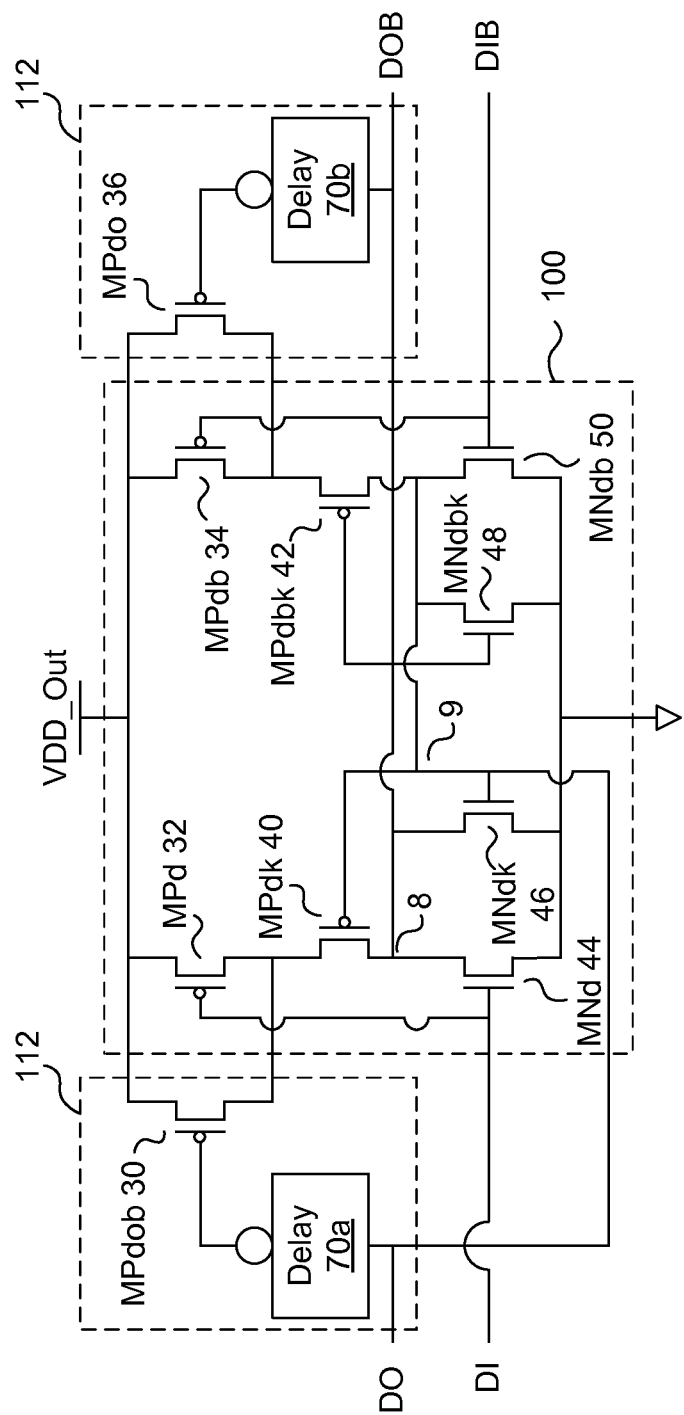
FIG. 5 illustrates a circuit diagram for another embodiment of a voltage level shifter of the present disclosure.

FIG. 5 illustrates a circuit diagram for another embodiment of a voltage level shifter of the present disclosure. A voltage level shifter of the present disclosure comprises: the main level shifting core 100, where the main level shifting core 100 shifts the data signal from the first voltage domain to the second voltage domain; and a configuration block 112, where the configuration block 112 configures the main level shifting core 100 as a function of the shifted data signal. The data signal can be a differential signal having the unbiased data signal DI and the biased data signal DIB. The voltage level shifter is configured for each signal transition of the shifted data signal.

The configuration block 112 comprises an inverted delay element 70$a$, an inverted delay element 70$b$, a PMOS transistor MPdob 30, and a PMOS transistor MPdo 36. The shifted unbiased data signal DO is inputted to the inverted delay element 70$a$. The inverted delay element 70$a$ outputs a delayed unbiased data signal to the gate of the PMOS transistor MPdob 30. The PMOS transistor MPdob 30 is connected in parallel to the PMOS transistor MPd 32. The shifted biased data signal DOB is inputted to the delay element 70$b$. The inverted delay element 70$b$ outputs a delayed biased data signal to the gate of the PMOS transistor MPdo 36. The PMOS transistor MPdo 36 is connected in parallel to the PMOS transistor MPdb 34.

Figure 6:
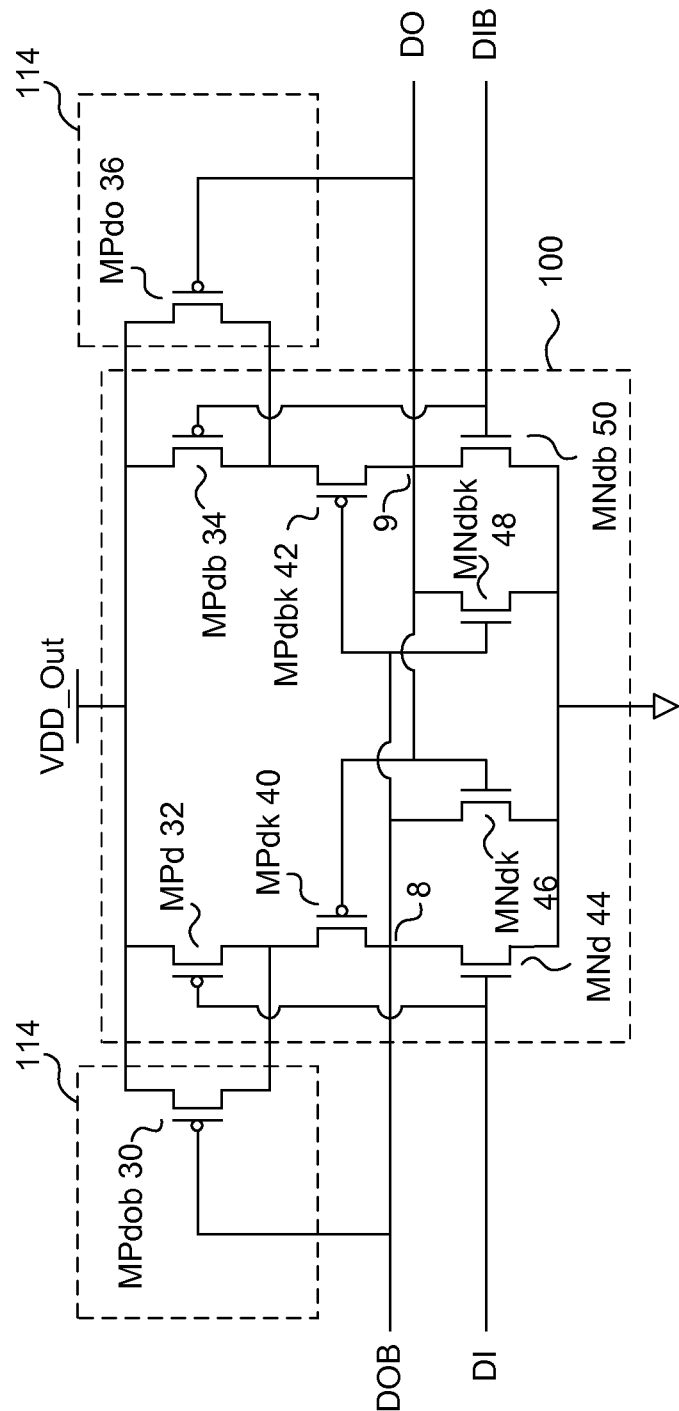
FIG. 6 illustrates a circuit diagram for yet another embodiment of a voltage level shifter of the present disclosure.

FIG. 6 illustrates a circuit diagram for yet another embodiment of a voltage level shifter of the present disclosure. A voltage level shifter of the present disclosure comprises: the main level shifting core 100, where the main level shifting core 100 shifts a data signal from the first voltage domain to the second voltage domain; and a configuration block 114, where the configuration block 114 configures the main level shifting core 100 as a function of the shifted data signal. The data signal can be a differential signal having the unbiased data signal DI and a biased data signal DIB. The voltage level shifter is configured for each signal transition of the shifted data signal.

The configuration block 114 comprises a PMOS transistor MPdob 30 and a PMOS transistor MPdo 36. The shifted biased data signal is inputted to the gate of the PMOS transistor MPdob 30. The PMOS transistor MPdob 30 is connected in parallel to the PMOS transistor MPd 32. The shifted unbiased data signal is inputted to the gate of the PMOS transistor MPdo 36. The PMOS transistor MPdo 36 is connected in parallel to the PMOS transistor MPdb 34.

Figure 7:
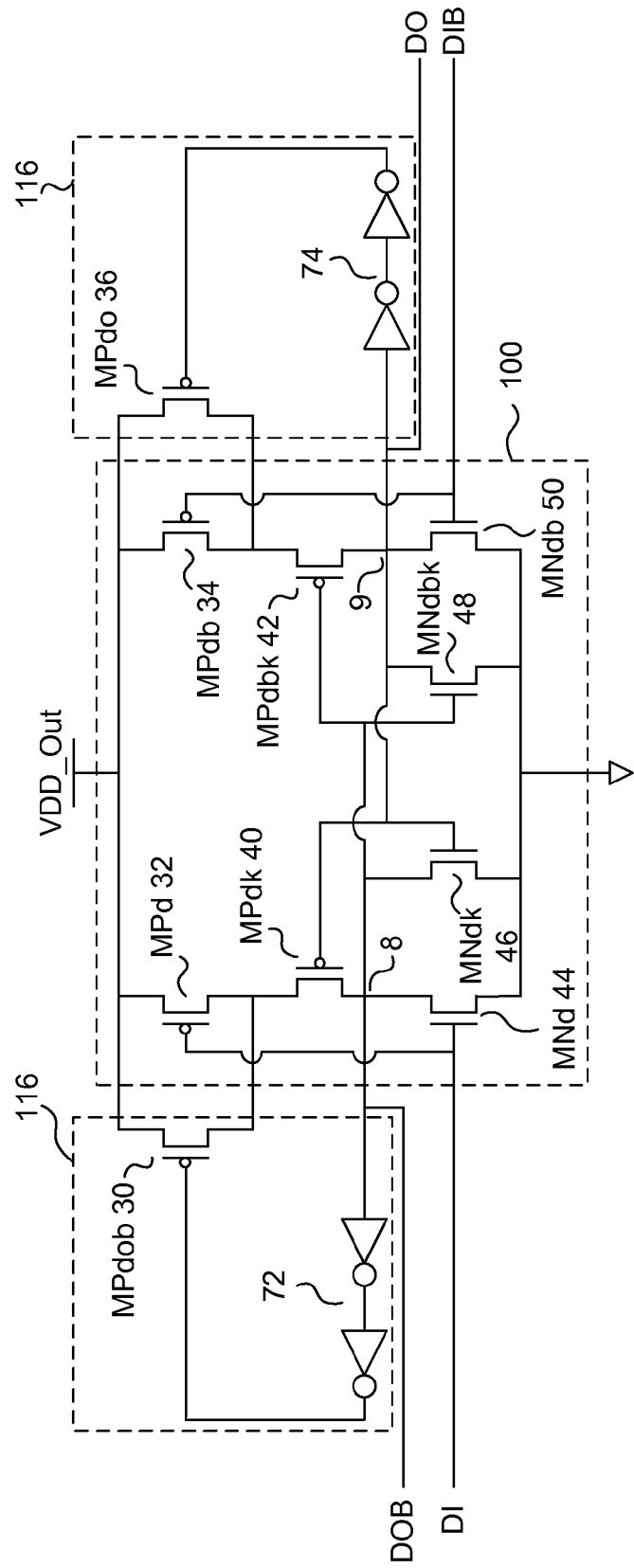
FIG. 7 illustrates a circuit diagram for an additional embodiment of a voltage level shifter of the present disclosure.

FIG. 7 illustrates a circuit diagram for an additional embodiment of a voltage level shifter of the present disclosure. A voltage level shifter of the present disclosure comprises: the main level shifting core 100, where the main level shifting core 100 shifts a data signal from the first voltage domain to the second voltage domain; and a configuration block 116, where the configuration block 116 configures the main level shifting core 100 as a function of the shifted data signal. The data signal can be a differential signal having the unbiased data signal DI and a biased data signal DIB. The voltage level shifter is configured for each signal transition of the shifted data signal.

The configuration block 116 comprises buffers 72, buffers 74, a PMOS transistor MPdob 30, and a PMOS transistor MPdo 36. The shifted biased data signal DOB is inputted to the buffers 72. The buffers 72 output a delayed biased data signal to the gate of the PMOS transistor MPdob 30. The PMOS transistor MPdob 30 is connected in parallel to the PMOS transistor MPd 32. The shifted unbiased data signal DO is inputted to the buffers 74. The buffers 74 output a delayed unbiased data signal to the gate of the PMOS transistor MPdo 36. The PMOS transistor MPdo 36 is connected in parallel to the PMOS transistor MPdb 34.

While the disclosure has been described with reference to certain embodiments, it is to be understood that the disclosure is not limited to such embodiments. Rather, the disclosure should be understood and construed in its broadest meaning, as reflected by the following claims. Thus, these claims are to be understood as incorporating not only the apparatuses, methods, and systems described herein, but all those other and further alterations and modifications as would be apparent to those of ordinary skilled in the art.

I claim:

1. A voltage level shifter, comprising:
    a main level shifting core, wherein the main level shifting core shifts a data signal from a first voltage domain to a second voltage domain; and
    a configuration block, wherein the configuration block configures the main level shifting core as a function of the shifted data signal,
    wherein the data signal is a differential signal having an unbiased data signal and a biased data signal,
    wherein the main level shifting core comprises two branches connected in parallel across a predefined voltage and ground,
    wherein the first branch comprises a first P-type metal-oxide-semiconductor ("PMOS") transistor, a second PMOS transistor, a first N-type metal-oxide-semiconductor ("NMOS") transistor, and a second NMOS transistor,
    wherein the first and second NMOS transistors are connected in parallel,
    wherein the first PMOS transistor and the second PMOS transistor are connected in series to the first and second NMOS transistors at a first connection,
    wherein the second branch comprises a third PMOS transistor, a fourth PMOS transistor, a third NMOS transistor, and a fourth NMOS transistor,
    wherein the third and fourth NMOS transistors are connected in parallel,
    wherein the third PMOS transistor and the fourth PMOS transistor are connected in series to the third and fourth NMOS transistors at a second connection,
    wherein the unbiased data signal is applied to the gates of the first PMOS transistor and the first NMOS transistor,
    wherein the biased data signal is applied to the gates of the third PMOS transistor and the third NMOS transistor,
    wherein the gates of the second PMOS transistor and the second NMOS transistor are connected to the second connection,
    wherein a shifted unbiased data signal is generated at the second connection,
    wherein the gates of the fourth PMOS transistor and the fourth NMOS transistor are connected to the first connection, and
    wherein a shifted biased data signal is generated at the first connection.

2. The voltage level shifter of claim 1 wherein the voltage level shifter is configured for each signal transition of the shifted data signal.

3. The voltage level shifter of claim 1 wherein the configuration block comprises a first delay element, a second delay element, a fifth PMOS transistor, and a sixth PMOS transistor, wherein the shifted biased data signal is inputted to the first delay element, wherein the first delay element outputs a delayed biased data signal to the gate of the fifth PMOS transistor, wherein the fifth PMOS transistor is connected in parallel to the first PMOS transistor, wherein the shifted unbiased data signal is inputted to the second delay element, wherein the second delay element outputs a delayed unbiased data signal to the gate of the sixth PMOS transistor, and wherein the sixth PMOS transistor is connected in parallel to the third PMOS transistor.

4. The voltage level shifter of claim 1 wherein the configuration block comprises a first inverted delay element, a second inverted delay element, a fifth PMOS transistor, and a sixth PMOS transistor, wherein the shifted unbiased data signal is inputted to the first inverted delay element, wherein the first inverted delay element outputs a delayed unbiased data signal to the gate of the fifth PMOS transistor, wherein the fifth PMOS transistor is connected in parallel to the first PMOS transistor, wherein the shifted biased data signal is inputted to the second inverted delay element, wherein the second inverted delay element outputs a delayed biased data signal to the gate of the sixth PMOS transistor, and wherein the sixth PMOS transistor is connected in parallel to the third PMOS transistor.

5. The voltage level shifter of claim 1 wherein the configuration block comprises a fifth PMOS transistor and a sixth PMOS transistor, wherein the shifted biased data signal is inputted to the gate of the fifth PMOS transistor, wherein the fifth PMOS transistor is connected in parallel to the first PMOS transistor, wherein the shifted unbiased data signal is inputted to the gate of the sixth PMOS transistor, and wherein the sixth PMOS transistor is connected in parallel to the third PMOS transistor.

6. A method for voltage level shifting, comprising the steps of:
    receiving a data signal in a first voltage domain by a voltage level shifter, wherein the data signal is a differential signal having an unbiased data signal and a biased data signal;
    shifting the received data signal to a second voltage domain by the voltage level shifter, wherein the voltage level shifter is configured as a function of the shifted data signal, wherein the voltage level shifter is configured for each signal transition of the shifted data signal, and wherein the shifted data signal is delayed a predefined amount of time before being used to configure the voltage level shifter; and
    outputting the shifted data signal, wherein the shifted data output signal is equalized, wherein the voltage level shifter comprises:
a main level shifting core, wherein the main level shifting core shifts a data signal from a first voltage domain to a second voltage domain; and
a configuration block, wherein the configuration block configures the main level shifting core as a function of the shifted data signal,
wherein the main level shifting core comprises two branches connected in parallel across a predefined voltage and ground,
wherein the first branch comprises a first P-type metal-oxide-semiconductor ("PMOS") transistor, a second PMOS transistor, a first N-type metal-oxide-semiconductor ("NMOS") transistor, and a second NMOS transistor,
wherein the first and second NMOS transistors are connected in parallel,
wherein the first PMOS transistor and the second PMOS transistor are connected in series to the first and second NMOS transistors at a first connection,
wherein the second branch comprises a third PMOS transistor, a fourth PMOS transistor, a third NMOS transistor, and a fourth NMOS transistor,
wherein the third and fourth NMOS transistors are connected in parallel,
wherein the third PMOS transistor and the fourth PMOS transistor are connected in series to the third and fourth NMOS transistors at a second connection,
wherein the unbiased data signal is applied to the gates of the first PMOS transistor and the first NMOS transistor,
wherein the biased data signal is applied to the gates of the third PMOS transistor and the third NMOS transistor,
wherein the gates of the second PMOS transistor and the second NMOS transistor are connected to the second connection,
wherein a shifted unbiased data signal is generated at the second connection,
wherein the gates of the fourth PMOS transistor and the fourth NMOS transistor are connected to the first connection, and
wherein a shifted biased data signal is generated at the first connection.

7. The method of claim 6 wherein the configuration block comprises a first delay element, a second delay element, a fifth PMOS transistor, and a sixth PMOS transistor, wherein the shifted biased data signal is inputted to the first delay element, wherein the first delay element outputs a delayed biased data signal to the gate of the fifth PMOS transistor, wherein the fifth PMOS transistor is connected in parallel to the first PMOS transistor, wherein the shifted unbiased data signal is inputted to the second delay element, wherein the second delay element outputs a delayed unbiased data signal to the gate of the sixth PMOS transistor, and wherein the sixth PMOS transistor is connected in parallel to the third PMOS transistor.

8. The method of claim 6 wherein the configuration block comprises a first inverted delay element, a second inverted delay element, a fifth PMOS transistor, and a sixth PMOS transistor, wherein the shifted unbiased data signal is inputted to the first inverted delay element, wherein the first inverted delay element outputs a delayed unbiased data signal to the gate of the fifth PMOS transistor, wherein the fifth PMOS transistor is connected in parallel to the first PMOS transistor, wherein the shifted biased data signal is inputted to the second inverted delay element, wherein the second inverted delay element outputs a delayed biased data signal to the gate of the sixth PMOS transistor, and wherein the sixth PMOS transistor is connected in parallel to the third PMOS transistor.

9. The method of claim 6 wherein the configuration block comprises a fifth PMOS transistor and a sixth PMOS transistor, wherein the shifted biased data signal is inputted to the gate of the fifth PMOS transistor, wherein the fifth PMOS transistor is connected in parallel to the first PMOS transistor, wherein the shifted unbiased data signal is inputted to the gate of the sixth PMOS transistor, and wherein the sixth PMOS transistor is connected in parallel to the third PMOS transistor.

* * * * *